(12) United States Patent
Xiang et al.

(10) Patent No.: US 6,239,452 B1
(45) Date of Patent: May 29, 2001

(54) SELF-ALIGNED SILICIDE GATE TECHNOLOGY FOR ADVANCED DEEP SUBMICRON MOS DEVICE

(75) Inventors: Qi Xiang, Santa Clara; Shekhar Pramanick, Fremont; Ming-Ren Lin, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/320,682

(22) Filed: May 27, 1999

Related U.S. Application Data

(62) Division of application No. 08/966,288, filed on Nov. 7, 1997, now Pat. No. 5,937,315.

(51) Int. Cl.$^7$ .......................... H01L 21/84; H01L 31/20; H01L 29/04; H01L 21/3205
(52) U.S. Cl. .............................. 257/57; 257/72; 257/413; 438/166; 438/592
(58) Field of Search ................................. 438/166, 592; 257/413, 57, 72

(56) References Cited

U.S. PATENT DOCUMENTS

| | | | |
|---|---|---|---|
| 5,431,770 | * 7/1995 | Lee et al. . | |
| 5,625,217 | * 4/1997 | Chau et al. | 257/412 |
| 5,646,424 | * 7/1997 | Zhang et al. | 257/66 |
| 5,907,784 | * 5/1999 | Larson | 438/592 |
| 5,937,315 | * 8/1999 | Xiang et al. | 438/486 |
| 5,972,785 | * 10/1999 | Shishiguchi et al. | 438/592 |
| 6,025,254 | * 2/2000 | Doyle et al. | 438/592 |
| 6,054,774 | * 4/2000 | Hu et al. | 257/413 |
| 6,091,115 | * 7/2000 | Ohtani et al. | 257/369 |
| 6,096,581 | * 8/2000 | Zhang et al. | 438/149 |
| 6,103,606 | * 8/2000 | Wu et al. | 438/586 |

\* cited by examiner

*Primary Examiner*—Richard Booth
(74) *Attorney, Agent, or Firm*—Davis Chin

(57) ABSTRACT

A deep submicron MOS device having a self-aligned silicide gate structure and a method for forming the same is provided so as to overcome the problems of poly-Si depletion and boron penetration. A first Nickel silicide layer is formed between a gate oxide and a polycrystalline silicon gate electrode. Further, second Nickel silicide layers are formed over highly-doped source/drain regions. In this fashion, the reliability of the MOS device will be enhanced.

3 Claims, 1 Drawing Sheet

SELF-ALIGNED SILICIDE GATE TECHNOLOGY FOR ADVANCED DEEP SUBMICRON MOS DEVICE

CROSS REFERENCE TO RELATED APPLICATION

This application is a division of application Ser. No. 08/966,288 filed on Nov. 7, 1997 U.S. Pat. No. 5,937,315.

BACKGROUND OF THE INVENTION

FIELD OF THE INVENTION

This invention relates generally to ultra-large scale integration (ULSI) MOS integrated circuits. More particularly, it relates to a method for fabricating deep submicron CMOS integrated circuits with a self-aligned silicide gate electrode so as to eliminate poly-Si depletion and to suppress the penetration effects of boron ions.

As is generally well-known, a CMOS (complementary metal-oxide semiconductor) device is comprised of an N-channel MOS device and a P-channel MOS device. In particular, deep-submicron CMOS is the primary technology for ULSI (Ultra-Large Scale Integration) systems. In order to increase the speed of the MOS devices, there has existed in the microelectronics industry over the last two decades a continuing trend of scaling-down the structures to smaller and smaller sizes. However, as the device dimensions are scaled down, the gate oxide thickness has to be likewise reduced down to provide optimal device performance.

Thus, there has been proposed heretofore of using a $P^+$-type polycrystalline silicon (poly-Si) gate so as to provide a surface channel feature in P-channel MOS devices in deep-submicron CMOS structures. This is due to the fact that surface-channel P-channel MOS devices with $P^+$-type poly-Si gates can improve short-channel and sub-threshold I–V characteristics and produce better controllability of the threshold voltage. Typically, $BF_2^+$ ions are implanted simultaneously with the forming of the $P^+$ poly-Si gate and a $P^+$-N shallow junction. The presence of fluorine ions during the $BF_2$ implantation enhances the diffusion of boron ions. As a result, there will be a penetration of boron ions through the gate oxide which introduces boron ions to the underlying silicon substrate. Boron penetration results unfortunately in degrading the reliability of the devices, such as positive shifts in the threshold voltage, increased sub-threshold swing, and increased electron trapping.

Accordingly, one of the major concerns for existing dual gate CMOS technology is the problem of boron penetration due to gate oxide scaling-down. Another major concern caused by the gate oxide reduction is poly-Si gate depletion which produces an "excess oxide thickness" that can be quite significant in an ultra-thin gate oxide. The poly-Si depletion will degrade the drive current ability of the P-channel MOS devices. Therefore, the problems of boron penetration and poly-Si gate depletion are considered to be the two important factors which limit the performance of deep submicron devices.

In view of the foregoing, there still exists as need of a method for fabricating deep-submicron CMOS integrated circuits with a self-aligned silicide gate electrode so as to eliminate poly-Si depletion and to suppress the penetration effects of boron ions.

SUMMARY OF THE INVENTION

Accordingly, it is a general object of the present invention to provide a method for fabricating deep sub-micron CMOS integrated circuits with a self-aligned silicide gate electrode.

It is an object of the present invention to provide a method for fabricating deep submicron CMOS integrated circuits with a self-aligned silicide gate electrode so as to eliminate poly-Si depletion and to suppress the penetration effects of boron ions.

It is another object of the present invention to provide a method for fabricating a self-aligned silicide gate electrode for deep submicron MOS devices utilizing a metal-induced crystallization process.

It is still another object of the present invention to provide a MOS device having a self-aligned silicide gate structure which includes a Nickel silicide layer formed between the gate oxide and the polycrystalline silicon gate electrode.

In accordance with a preferred embodiment of the present invention, there is provided a method for fabricating a deep submicron MOS device having a self-aligned silicide gate structure. A gate oxide is formed on a surface of a semiconductor substrate. An amorphous silicon layer is deposited on a surface of the gate oxide. The amorphous silicon layer is patterned so as to form a gate electrode on a surface of the gate oxide. Shallow source/drain extension regions are formed on opposite sides of the gate electrode and in the semiconductor substrate. Sidewall spacers are formed on sidewalls of the gate electrodes. Highly-doped source/drain regions are then formed on opposite sides of the sidewall spacers and in the semiconductor substrate.

A thin Nickel layer is deposited over the semiconductor substrate. Thereafter, the semiconductor substrate is heated to cause metal-induced crystallization of the amorphous silicon layer into polycrystalline silicon in order to form a Nickel silicide layer between the gate oxide and the polycrystalline silicon gate electrode and Nickel silicide layers over the highly-doped source/drain regions. Finally, an unsilicided Nickel layer is removed from a surface of the sidewall spacers.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

As previously described, conventional dual gate CMOS technology includes the problems of poly-Si gate depletion and boron penetration when scaling-down. The purpose of the present invention is to provide a new technique for realizing a self-aligned metal silicide gate electrode for advanced deep-submicron MOS devices which overcomes these aforementioned problems. In view of this, the inventors of the instant invention have developed a way of utilizing a technique based upon a metal-induced crystallization (MIC) phenomenon. This MIC phenomenon occurs when some type of metal is placed on a surface of amorphous silicon and a thermal treatment is subsequently performed. As consequence, the metal can induce crystallization with a lower temperature level, which is below the required temperature level at which crystallization of amorphous silicon is achieved through the process called "solid-phase crystallization" (SPC).

It is generally known that the SPC process for amorphous silicon begins at about 600° C. Thus, the type of metal for the MIC process must be taken into consideration. That is, the following criteria of the metal used in the MIC process must be met: (1) the metal must be capable of reacting with amorphous silicon and forming metal silicide at a lower temperature than 600° C., and (2) the lattice structure of the metal silicide is required to be very close to the same lattice structure of silicon. During the subsequent thermal treatment, a metal silicide is initially formed and the metal silicide will then act as a seed crystal for the crystallization of amorphous silicon. During the growth of the crystal seed, the metal silicide will move and remain in the growing front until the completion of the crystallization.

For the gate electrode, the type of metal having the above-described characteristics appear to be found in Nickel (Ni). In an article authored by Seok-Woon Lee and Seung-Ki Joo and entitled "Low Temperature Poly-Si Thin-Film Transistor Fabrication by Metal-Induced Lateral Crystallization," IEEE Electron Device Letters, Vol. 17, No. 4, p.160, 1996, it was reported that Nickel is able to enhance crystallization of amorphous silicon through the MIC process. Accordingly, the metal selected for use in the present invention in order to achieve the self-aligned metal silicide gate electrode with a minimal amount of change in the existing CMOS technology is Nickel. This inventive technique is useful in advanced deep-submicron MOS devices, such as sub-0.1 µm device having an ultra-thin gate oxide.

Figure 1:
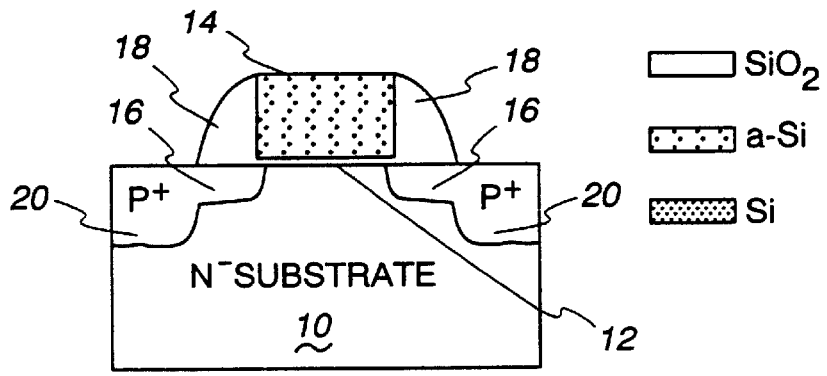
FIGS. 1 through 4 show the manufacturing steps for fabricating a self-aligned metal silicide gate electrode in deep submicron MOS devices, according to the principles of the present invention.

With reference now to FIGS. 1 through 4 of the drawings, there are shown the manufacturing steps for fabricating a self-aligned silicide gate electrode for deep submicron MOS devices, according to the principles of the present invention. In FIG. 1, there is illustrated an n⁻ silicon substrate 10 on which its top surface has formed a gate oxide 12. The thickness of the gate oxide is preferably in the range of about 20 to 40 Å. Unlike the typical poly-Si gate used in a conventional MOS device, an amorphous silicon layer is formed over the surface of the gate oxide 12 according to a conventional CMOS production method. The amorphous silicon layer has a thickness preferably in the range of 1500–2000 Å. Thereafter, the amorphous silicon layer is patterned into a gate electrode 14 having vertical sidewalls and a top surface. Next, impurity ions are introduced into the silicon substrate 10 using the gate electrode 14 as a mask to form shallow source/drain extension regions 16 at a self-aligned position with the gate electrode 14. The ions can be boron or $BF_2$ and can be implanted at a dose between $5\times10^{14}$ to $1\times10^{15}$ ions/cm² at an energy of 1–10 KeV.

Next, an insulating layer (not shown) is formed over the surface of the semiconductor substrate 10 and over the gate electrode 14. Still referring to FIG. 1, the insulating layer is anisotropic etched to form sidewall spacers 18 on the sidewalls of the gate electrode 14. The insulating layer is preferably silicon dioxide formed by a chemical vapor deposition (CVD) process. The side-wall spacers 18 preferably have a bottom width in the range of about 500 to 1000 Å. Then, impurity ions are implanted into the semiconductor substrate using the gate electrode 14 and the sidewall spacers 18 as a mask to form highly-doped P⁺ source/drain regions 20 at a self-aligned position with the sidewall spacers 18. The ions can again be boron or $BF_2$ and implanted at a dose of $2\times10^{15}$ ions/cm² and an energy of 10–30 KeV. The semiconductor substrate 10 is then thermal annealed to activate the highly-doped source/drain region 20. The thermal anneal is preferably performed at a temperature in the range of 900–1050° C., for a time between 10 to 60 seconds.

Figure 2:
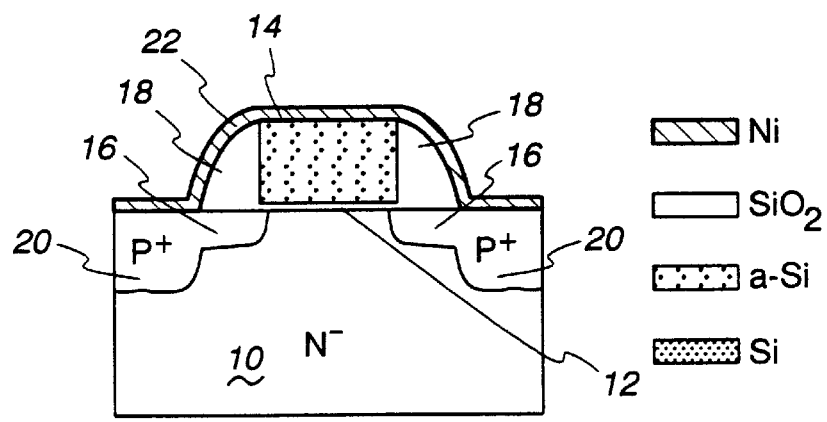
Figure 3:
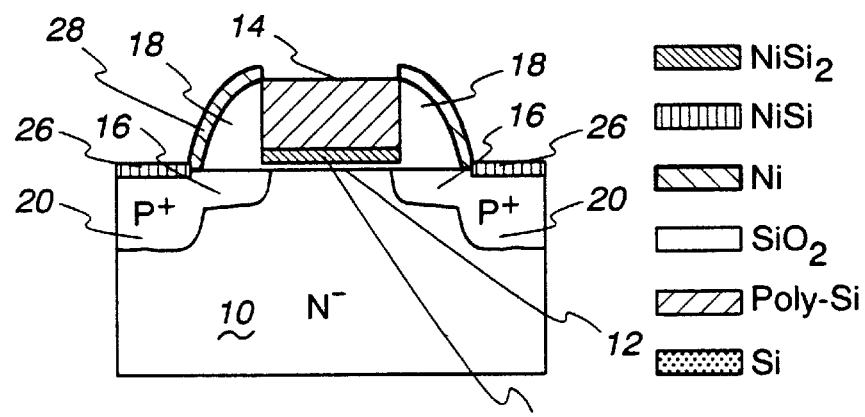

As depicted in FIG. 2, a thin Nickel (Ni) layer 22 is deposited over the entire surface of the silicon substrate by evaporation, sputtering, or CVD. The thickness of the Ni layer 22 is in the range of 100 to 300 Å and is preferably about 200 Å. After the Ni deposition, the substrate 10 is then subjected to a thermal treatment with a temperature of approximately 500° C. The time period of the thermal treatment is determined by what is needed for the completion of the MIC of amorphous silicon depending upon the growth rate of MIC and the thickness of the amorphous silicon. As a result, the amorphous silicon in the gate electrode 14 will be crystallized into a polycrystalline silicon (poly-Si) and a Nickel disilicide ($NiSi_2$) layer 24 will be formed at the interface of the gate oxide 12 and the poly-Si gate electrode 14, as illustrated in FIG. 3. In addition, Ni monosilicide (NiSi) layers 26 will be formed over the highly-doped source/drain regions 20 outside of the sidewall spacers 18.

It should be apparent to those skilled in the art that the Nickel silicidation with amorphous silicon will be different than with crystalline silicon at the same temperature. In the above article to S. Lee et al., it was described that Nickel silicidation with amorphous silicon at 500° C. will produce Nickel disilicide ($NiSi_2$). It was reported in an article authored by W. R. Aderhold et al. and entitled "GOI Impact of Cu, Ni and Al Atoms on the Wafer Surface Prior to RTP and Furnace Oxidations," Rapid Thermal and Integrated Processing V. Symposium, San Francisco, Apr. 8–12, 1996, that Nickel sulfide has no detrimental effects on the gate oxide integrity (GOI), which is a major concern for many metal or metal-like gate electrodes. Further, in an article authored by T. Morimoto et al. and entitled "A NiSi Silicide Technology For Advanced Logic Devices," IEDM 1991 Tech. Dig., p. 653, 1991, it was reported that Nickel silicidation with crystalline silicon at 500° C. will produce Nickel monosilicide (NiSi). The NiSi layers formed over the highly-doped source/drain regions can provide thin silicide films with relatively low sheet resistance and low contact resistance, which is essential for shallow junctions in deep-submicron devices.

Figure 4:
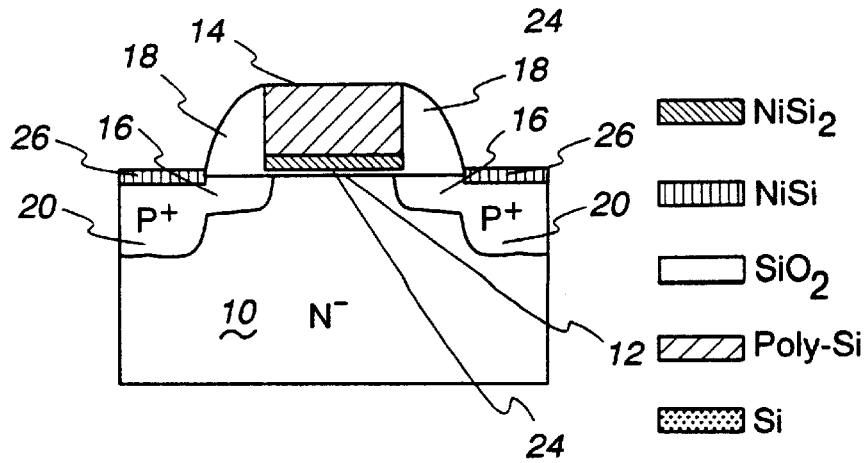

After the MIC process, the unsilicided Nickel layer 28 on the surface of the sidewall spacers 18 is selectively etched using a wet etch with a solution containing hydrochloric acid (HCL). For example, a mixed acid of nitric acid ($HNO_3$) and hydrochloric acid may be used. Also, a mixed solution of hydrogen peroxide ($H_2O_2$), hydrochloric acid (HCL) and water ($H_2O$) may be used. This resultant structure is shown in FIG. 4. Following this, the subsequent remaining process flow steps of the ULSI fabrication are the same as those in the conventional dual gate CMOS production and thus will not be described.

From the above described manufacturing steps of the present invention, the drawbacks of the poly-Si depletion and boron ion penetration have been overcome. The Ni silicide layer 24 formed between the poly-Si gate 14 and the gate oxide 12 can prevent the fluorine ion from being spread out and reduce the amount of fluorine ion accumulated in the gate oxide, thereby suppressing the effect boron ion penetration due to the fluorine ion. As a result, the suppression of boron penetration through the gate oxide 12 into the silicon substrate 10 underneath will enhance the reliability of the MOS device and other related characteristics.

The manufacturing method of the present invention for fabricating a self-aligned silicide gate oxide have the following advantages over the prior art techniques:

(1) it is completely compatible with the existing CMOS technology;

(2) it requires only a minimal change to the existing CMOS technology;

(3) it can overcome the problems of poly-Si gate depletion and boron penetration;

(4) the Ni silicide layers do not adversely affect the gate oxide integrity; and (5) the Nickel monosilicide layers 26 on the highly-doped source/drain regions provide thin silicide films with relatively low sheet resistance and low contact resistance.

From the foregoing detailed description, it can thus be seen that the present invention provides a method of fabricating a deep submicron MOS device having a self-aligned silicide gate structure. A first Ni silicide layer is formed between the gate oxide and the polycrystalline silicon gate electrode. Further, second Ni silicide layers are formed over the highly-doped source/drain regions. As a result, the drawbacks of poly-Si depletion and boron ion penetration have been overcome.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A MOS device having a self-aligned silicide gate structure for eliminating poly-Si depletion and for suppressing the penetration of boron ions comprising:

a semiconductor substrate;

a gate oxide formed on a surface of said semiconductor substrate;

a polycrystalline silicon gate electrode formed on a surface of said gate oxide;

shallow source/drain extension regions formed at a self-aligned position on opposite sides of said gate electrode and in said semiconductor substrate;

sidewall spacers formed on sidewalls of said gate electrode;

highly-doped source/drain regions formed at a self-aliened position on opposite sides of said sidewall spacers and in said semiconductor substrate;

a first Nickel disilicide layer formed between said gate oxide and said polycrystalline silicon gate oxide for suppressing the penetration effects of the boron ions into said silicon substrate; and second Nickel monosilicide layers having relatively low sheet resistance and low contact resistance and being formed over said highly-doped source/drain regions.

2. A MOS device as claimed in claim 1, wherein said gate oxide has a thickness in a range of about 20 to 40 Å.

3. A MOS device as claimed in claim 1, wherein said sidewall spacers have a bottom width in a range of about 500 to 1000 Å.

\* \* \* \* \*

UNITED STATES PATENT AND TRADEMARK OFFICE
CERTIFICATE OF CORRECTION

PATENT NO. : 6,239,452 B1  
DATED : May 29, 2001  
INVENTOR(S) : Qi Xiang et al.

Page 1 of 1

It is certified that error appears in the above-identified patent and that said Letters Patent is hereby corrected as shown below:

<u>Column 6,</u>  
Line 17, change "alianed" to -- aligned --

Signed and Sealed this

Thirteenth Day of November, 2001

Attest:

NICHOLAS P. GODICI  
Attesting Officer    Acting Director of the United States Patent and Trademark Office